US010884300B2

(12) United States Patent
Kim et al.

(10) Patent No.: US 10,884,300 B2
(45) Date of Patent: Jan. 5, 2021

(54) DISPLAY DEVICE

(71) Applicant: Samsung Display Co., Ltd., Yongin-si (KR)

(72) Inventors: Sang-youn Kim, Hwaseong-si (KR); Yeunmo Yeon, Asan-si (KR); Jaenam Moon, Seoul (KR); Seyoung Oh, Osan-si (KR); Jinsung Choi, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/403,252

(22) Filed: May 3, 2019

(65) Prior Publication Data

US 2020/0012141 A1 Jan. 9, 2020

(30) Foreign Application Priority Data

Jul. 9, 2018 (KR) .......................... 10-2018-0079288

(51) Int. Cl.
*H05K 1/00* (2006.01)
*G02F 1/1345* (2006.01)
*H05K 1/14* (2006.01)

(52) U.S. Cl.
CPC ......... *G02F 1/13452* (2013.01); *H05K 1/147* (2013.01); *H05K 2201/10136* (2013.01)

(58) Field of Classification Search
USPC ........................................................ 361/749
See application file for complete search history.

(56) References Cited

U.S. PATENT DOCUMENTS

| 9,716,190 B2 | 7/2017 | Tsukagoshi et al. | |
| 2015/0029436 A1* | 1/2015 | Nakayama | H05K 1/189 349/58 |
| 2019/0067844 A1* | 2/2019 | Go | H05K 1/144 |

FOREIGN PATENT DOCUMENTS

| KR | 10-2011-0070158 A | 6/2011 |
| KR | 10-1266703 | 5/2013 |
| KR | 10-2016-0043190 A | 4/2016 |
| KR | 10-2016-0051401 A | 5/2016 |
| KR | 10-2016-0113982 A | 10/2016 |
| KR | 10-1726577 | 4/2017 |

* cited by examiner

*Primary Examiner* — Andargie M Aychillhum
(74) *Attorney, Agent, or Firm* — Lewis Roca Rothgerber Christie LLP

(57) ABSTRACT

A display device is provided. The display device includes a display panel including a plurality of pixels, at least one flexible circuit board connected to one side of the display panel and including a first portion and a second portion around the first portion, a source driving chip on the first portion, and a plurality of adhesion patterns on the second portion and extending in a set or predetermined direction.

20 Claims, 9 Drawing Sheets

DISPLAY DEVICE

CROSS-REFERENCE TO RELATED APPLICATIONS

This application claims priority to and the benefit of Korean Patent Application No. 10-2018-0079288, filed on Jul. 9, 2018, the entire content of which is hereby incorporated by reference.

BACKGROUND

1. Field

One or more aspects of example embodiments of the present disclosure are related to a display device, and for example, to a display device including flexible circuit boards with enhanced stress (e.g., stiffness).

2. Description of the Related Art

Generally, a display device includes a display panel including a plurality of pixels, and a plurality of source driving chips driving the plurality of pixels. The source driving chips may be mounted on a plurality of flexible circuit boards, which may be connected to one side of the display panel. The source driving chips may be connected to the display panel through the flexible circuit boards.

A plurality of first pads connected to the source driving chip may be on one side of each of the flexible circuit boards, and a plurality of second pads connected to the pixels may be on one side of the display panel. The first pads may be positioned on and aligned with the second pads to overlap the second pads. After the first pads are aligned with the second pads, the first pads are electrically connected to the second pads to allow the source driving chips to be connected to the pixels.

As the display device becomes larger, the size of each of the flexible circuit boards becomes larger. One side of each of the flexible circuit boards is positioned on (e.g., attached to) one side of the display panel to position the first pads on the second pads. However, as the size of each flexible circuit board increases, a degree of bending of each flexible circuit board may increase. As a result, the sides (e.g., edges) of each flexible circuit board may droop downward. In this case, it may be difficult to align the first pads on each flexible circuit board with the second pads on the display panel.

SUMMARY

One or more aspects of example embodiments of the present disclosure are directed toward a display device in which stress (e.g., stiffness) of a flexible circuit board is enhanced to facilitate alignment of pads connecting the flexible circuit board to a display panel.

One or more example embodiments of the present disclosure provide a display device including: a display panel including a plurality of pixels; at least one flexible circuit board connected to one side of the display panel and including a first portion and a second portion around the first portion; a source driving chip on the first portion; and a plurality of adhesion patterns on the second portion and extending in a set or predetermined direction.

According to one or more embodiments of the present disclosure, a display device includes: a display panel including a plurality of pixels; a plurality of flexible circuit boards, each connected to one side of the display panel and including a first portion and a second portion around the first portion; a plurality of source driving chips on the first portions of the flexible circuit boards; and a plurality of adhesion patterns on the second portions of the flexible circuit boards, wherein the adhesion patterns each include a plurality of first adhesion patterns extending in a direction crossing (e.g., perpendicular or normal to) the extension direction of the one side of the display panel.

According to one or more embodiments of the present disclosure, a display device includes: a display panel including a plurality of pixels; a plurality of flexible circuit boards having a rectangular shape having long sides in a first direction and short sides in a second direction crossing (e.g., perpendicular to) the first direction and connected to one side of the display panel; a plurality of source driving chips on the flexible circuit boards; and a plurality of adhesion patterns on the flexible circuit boards and extending from edges of each of the source driving chips, in one or more diagonal directions between the first direction and the second direction in a plane defined by the first direction and the second direction.

BRIEF DESCRIPTION OF THE DRAWINGS

The accompanying drawings are included to provide a fuller understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
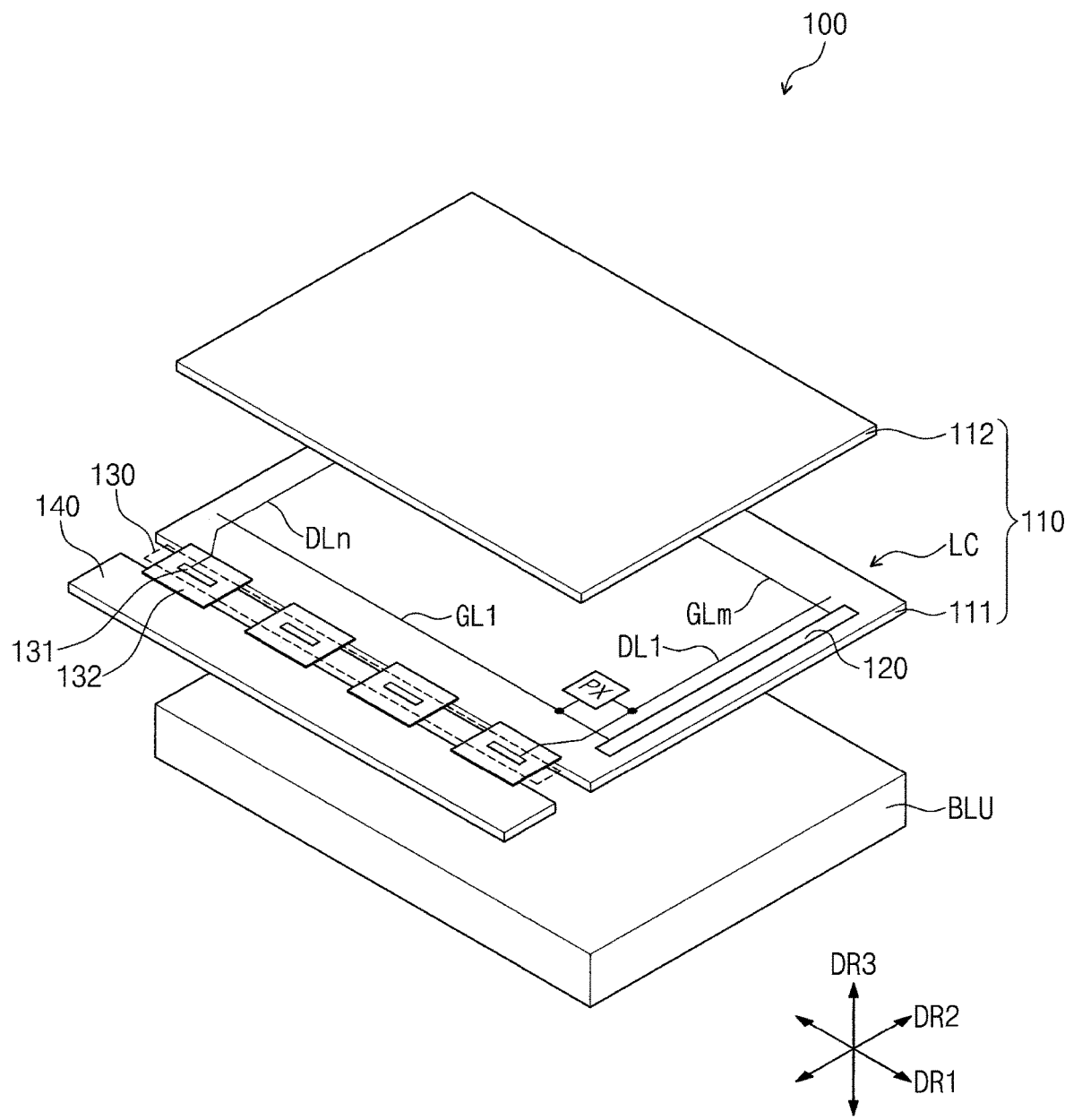
FIG. 1 is a perspective view of a display apparatus according to an embodiment of the present disclosure.

Advantages, features, and methods of implementing or achieving the present disclosure will be clarified through the following embodiments and described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Like reference numerals refer to like elements throughout, and duplicative descriptions thereof may not be provided.

In the drawings, the thicknesses of layers, films, panels, regions, etc., may be exaggerated for clarity. It will also be understood that when a layer is referred to as being "on" another layer or substrate, it can be directly on the other layer or substrate, or intervening layers may also be present. In contrast, when an element is referred to as being "directly on" another element or layer, there are no intervening elements or layers present. As used herein, the term "and/or" includes any and all combinations of one or more of the associated listed items. Expressions such as "at least one of", "one of", "selected from", "at least one selected from", and "one selected from", when preceding a list of elements, modify the entire list of elements and do not modify the individual elements of the list. Further, the use of "may" when describing embodiments of the present disclosure refers to "one or more embodiments of the present disclosure."

Spatially relative terms, such as "below", "beneath", "lower", "above", "upper" and the like, may be used herein for ease of description to describe one element or feature's relationship to another element(s) or feature(s) as illustrated in the drawings. The spatially relative terms should be understood as terms that include different directions of configurative elements in addition to directions illustrated in the drawings when using or operating the present disclosure.

It will be understood that although terms such as "first" and "second" are used herein to describe various elements and/or sections, these elements and/or sections should not be limited by these terms. These terms are only used to distinguish one element, component, or section from another element, component, or section. Accordingly, a first element, a first component, or a first section as described below may be alternatively termed a second element, a second component, or a second section, etc. within the scope of the present disclosure.

The embodiments herein may be described using schematic cross-sectional views and/or plan views as example views of the present disclosure. The shapes of these example views may vary or be modified according to manufacturing techniques and/or allowable errors. Therefore, embodiments of the present disclosure are not limited to the specific shape illustrated in the example views, but may include other suitable shapes that may be created according to manufacturing processes. The areas depicted in the drawings have general properties, are used to illustrate an example shape of a semiconductor package region, and should not be construed as limiting the scope of the present disclosure.

Hereinafter, example embodiments of the present disclosure will be described below in more detail with reference to the accompanying drawings.

FIG. 1 is a perspective view of a display apparatus according to an embodiment of the present disclosure.

Referring to FIG. 1, a display device 100 according to an embodiment of the present disclosure includes a display panel 110, a gate driving unit 120, a data driving unit 130, a printed circuit board 140, and a backlight unit BLU. Each of the display panel 110 and the backlight unit BLU has a rectangular shape having long sides in a first direction DR1 and short sides in a second direction DR2 crossing (e.g., perpendicular or normal to) the first direction DR1. However, the shapes of the display panel 110 and the backlight unit BLU are not limited thereto. Each of the first direction DR1 and the second direction DR2 may be bidirectional and may form a plane. A third direction DR3 extends perpendicular (normal) to the plane formed by DR1 and DR2, in the thickness directions of the display panel 110, the backlight unit BLU, etc.

The backlight unit BLU may be to generate and provide light to the display panel 110. The backlight unit BLU may have any suitable form, and for example, may be an edge type backlight unit or a direct type backlight unit. The display panel 110 may generate an image using the light provided by the backlight unit BLU. The generated image may be provided (shown) to a user through an upper portion of the display panel 110.

The display panel 110 may include a first substrate 111, a second substrate 112 facing the first substrate 111, and a liquid crystal layer LC between the first substrate 111 and the second substrate 112. A plurality of pixels PX, a plurality of gate lines GL1 to GLm, and a plurality of data lines DL1 to DLn may be on the first substrate 111. Here, m and n are natural numbers. For convenience of description, although only one pixel PX is illustrated in FIG. 1, a plurality of pixels PX may be included on the first substrate 111.

FIG. 1 illustrates a display device including a display panel 110 that is a liquid crystal display panel including a liquid crystal layer LC. However, embodiments of the present disclosure are not limited thereto. For example, various display panels capable of displaying images (such as organic light emitting display panels, electrophoretic display panels, and electrowetting display panels) may alternatively be used as the display panel.

The gate lines GL1 to GLm and the data lines DL1 to DLn may be insulated from each other while crossing each other. The gate lines GL1 to GLm may extend in the first direction DR1 and be connected to a gate driving unit 120. The data lines DL1 to DLn may extend in the second direction DR2 and be connected to a data driving unit 130.

The pixels PX may be on areas that are partitioned by the gate lines GL1 to GLm and the data lines DL1 to DLn, which cross each other. The pixels PX may be arranged in the form of a matrix and be connected to the gate lines GL1 to GLm and the data lines DL1 to DLn.

The gate driving unit 120 may be on a set or predetermined portion of the first substrate 111, adjacent to one of the short sides of the first substrate 111. The gate driving unit 120 may be formed in (e.g., during) the same process as the transistors of the pixels PX and then mounted on the first substrate 111 in the form of an amorphous silicon TFT gate driver circuit (ASG) or an oxide semiconductor TFT gate driver circuit (OSG).

However, embodiments of the present disclosure are not limited thereto. In some embodiments, for example, the gate driving unit 120 may be provided as a plurality of driving chips and mounted on a flexible printed circuit board that is connected to the first substrate 111 in the manner of a tape carrier package (TCP). In some embodiments, the gate driving unit 120 may be provided as a plurality of driving chips and mounted on the first substrate 111 in the manner of a chip on glass (COG).

The data driving unit 130 may include at least one source driving chip 131 on at least one flexible circuit board 132. For example, although four source driving chips 131 and four flexible circuit boards 132 are illustrated in FIG. 1, the number of source driving chips 131 and the number of flexible circuit boards 132 may vary or be selected according to a size of the display panel 110 without being limited to the numbers shown herein. In some embodiments, for example, one source driving chip 131 and one flexible circuit board 132 may be used, or two or more source driving chips 131 and two or more flexible circuit boards 132 may be used.

The source driving chips 131 may be mounted on the flexible circuit boards 132, and one side of each of the flexible circuit boards 132 may be connected to one side of the display panel 110. In some embodiments, for example, the flexible circuit boards 132 may be connected to a long side of the display panel 110. The extension direction of the long side of the display panel 110 may be parallel to the first direction DR1.

In some embodiments, for example, the flexible circuit boards 132 may be connected to a set or predetermined portion of the first substrate 111 adjacent to one long side of the first substrate 111 and a printed circuit board 140. Each of the flexible circuit boards 132 may have one side that is connected to the first substrate 111 and a second side opposite the first side that is connected to the printed circuit board 140.

Each of the source driving chips 131 and the flexible circuit boards 132 may have a rectangular shape having long sides in the first direction DR1 and short sides in the second direction DR2. However, embodiments of the present disclosure are not limited to the shapes of the source driving chips 131 and the flexible circuit boards 132 shown in FIG. 1. In some embodiments, the long side of a flexible circuit board 132 may refer to one side of the flexible circuit board 132.

The source driving chips 131 may be connected to the first substrate 111 and the printed circuit board 140 through the flexible circuit boards 132. The source driving chips 131 may be connected in the manner of a tape carrier package (TCP).

A timing controller may be on the printed circuit board 140. The timing controller may be mounted on the printed circuit board 140 in the form of an IC chip and connected to the gate driving unit 120 and the data driving units 130 through the flexible circuit boards 132. The timing controller may output a gate control signal, a data control signal, and/or image data.

The gate driving unit 120 may receive the gate control signal from the timing controller to generate a plurality of gate signals in response to the gate control signal. The gate driving unit 120 may sequentially output the gate signals. The gate signals may be provided to the pixels PX on a row-by-row basis through the gate lines GL1 to GLm. As a result, the pixels PX may be driven on a row-by-row basis.

The data driving unit 130 may receive the image data and/or the data control signal from the timing controller. The data driving unit 130 may generate and output analog type data voltages corresponding to the image data in response to the data control signal. The data voltages may be provided to the pixels PX through the data lines DL1 to DLn.

The pixels PX may receive the data voltages through the data lines DL1 to DLn in response to the gate signals received through the gate lines GL1 to GLm. The pixels PX may display gray scales corresponding to the data voltages. As a result, an image may be displayed.

Figure 2:
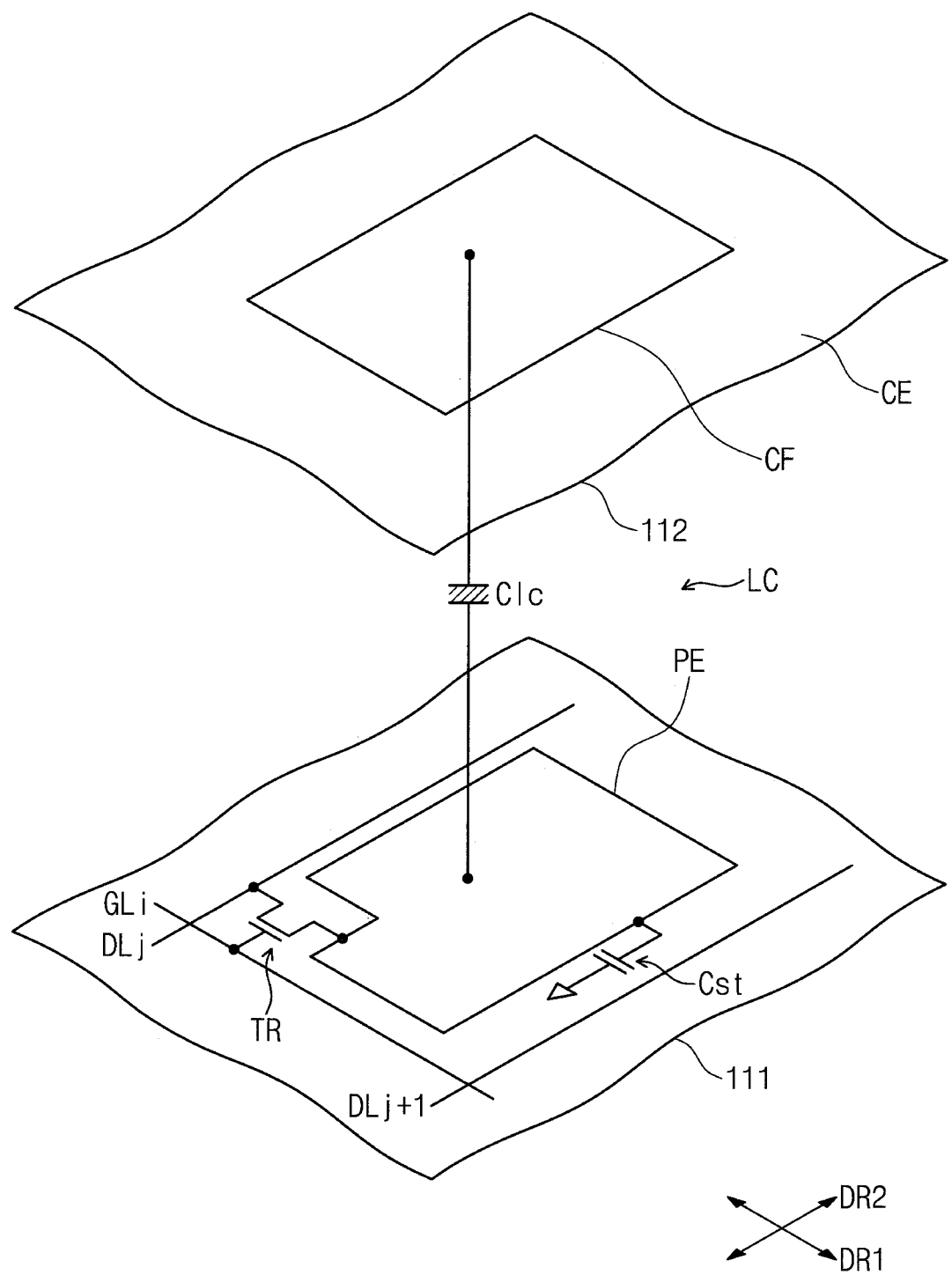
FIG. 2 is a view of a pixel as depicted in FIG. 1.

FIG. 2 is a view of the pixel as depicted in FIG. 1.

For convenience of description, although FIG. 2 illustrates a single pixel PX connected to a gate line GLi and a data line DLj, other pixels PX in the display panel 110 may each be the same the pixel PX of FIG. 2.

Referring to FIG. 2, the pixel PX may include a transistor TR connected to the gate line GLi and the data line DLj, a liquid crystal capacitor Clc connected to the transistor TR, and a storage capacitor Cst connected in parallel to the liquid crystal capacitor Clc. In some embodiments, the storage capacitor Cst may be omitted. Here, i and j are natural numbers, where i and j are indices referring to the relative positions of each line within an array of gate lines or data lines, and $DL_{j+1}$ refers to a data line adjacent to and having an index one large than the data line $DL_j$.

The transistor TR may be on the first substrate 111. The transistor TR may include a gate electrode connected to the gate line GLi, a source electrode connected to the data line DLj, and a drain electrode connected to the liquid crystal capacitor Clc and the storage capacitor Cst.

The liquid crystal capacitor Clc may include a pixel electrode PE on the first substrate 111, a common electrode CE on the second substrate 112, and the liquid crystal layer LC between the pixel electrode PE and the common electrode CE. The liquid crystal layer LC may serve as a dielectric. The pixel electrode PE may be connected to the drain electrode of the transistor TR.

Although the pixel electrode PE has a non-slit structure in FIG. 2, embodiments of the present disclosure are not limited thereto. In some embodiments, for example, the pixel electrode PE may have a slit structure including a stem part having a cross shape and a plurality of branch parts radially extending from the stem part.

The common electrode CE may be over an entire lower portion of the second substrate 112. However, embodiments of the present disclosure are not limited thereto. For example, the common electrode CE may be on the first substrate 111. In this case, at least one of the pixel electrode PE and the common electrode CE may have a slit.

The storage capacitor Cst may include (e.g., be formed from) the pixel electrode PE, a storage electrode branched from a storage line, and an insulation layer between the pixel electrode PE and the storage electrode. The storage line may be on the first substrate 111. The storage line and the gate lines GL1 to GLm may be formed on (within) the same layer at the same time. The storage electrode may at least partially overlap the pixel electrode PE.

The pixel PX may further include a color filter CF for representing red, green, and/or blue color light. In some embodiments, the color filter CF may be on the second substrate 112 as illustrated in FIG. 2. However, embodiments of the present disclosure are not limited thereto. In some embodiments, for example, the color filter CF may be on the first substrate 111.

The transistor TR may be turned on in response to a gate signal provided through the gate line GLi. A data voltage received through the data line DLj may be provided to the pixel electrode PE of the liquid crystal capacitor Clc through the transistor TR that is turned on. A common voltage may be applied to the common electrode CE.

Electric fields may be generated between the pixel electrode PE and the common electrode CE by a difference in voltage level between the data voltage and the common voltage. Liquid crystal molecules of the liquid crystal layer LC may operate by (e.g., change alignment in response to) the electric fields generated between the pixel electrode PE and the common electrode CE. Light transmittance may be adjusted by the liquid crystal molecules that operate by the electric field to thereby display an image.

A storage voltage having a uniform or substantially uniform voltage level may be applied to the storage line. However, embodiments of the present disclosure are not limited thereto. In some embodiments, for example, the common voltage may be applied to the storage line. The storage capacitor Cst may serve to compensate a charged amount of liquid crystal capacitor Clc.

Figure 3:
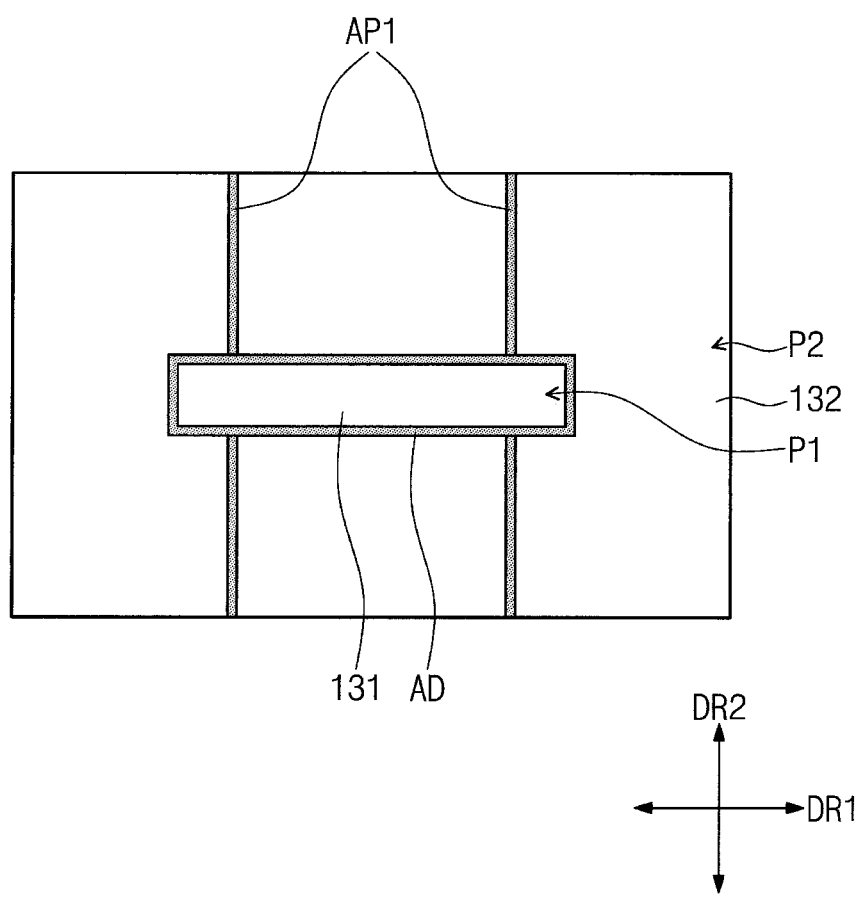
FIG. 3 is a plan view of one source driving chip mounted on a flexible circuit board as depicted in FIG. 1.

FIG. 3 is a plan view of a source driving chip mounted on a flexible circuit board as depicted in FIG. 1.

For convenience of description, although one flexible circuit board 132 is illustrated in FIG. 3, other or additional flexible circuit boards 132 may have the same constituents (e.g., components and/or structure) as the flexible circuit board 132 of FIG. 3.

Referring to FIG. 3, the flexible circuit board 132 may include a first portion P1 and a second portion P2 around the first portion P1. For example, the second portion P2 may surround the first portion P1. The first portion P1 may be defined as a portion of the flexible circuit board 132 on which the source driving chip 131 is positioned. The second portion P2 may be defined as a portion of the flexible circuit board 132 on which the source driving chip 131 is not positioned. For example, although the first portion P1 is positioned at a central portion of the flexible circuit board 132, embodiments of the present disclosure are not limited to this position of the first portion P1. In some embodiments, for example, the first portion P1 and the source driving chip 131 may be positioned at a non-central, non-centered, and/or peripheral region on the flexible circuit board 132.

The source driving chip 131 may be on the first portion P1 of the flexible circuit board 132. An adhesive agent AD may be on and/or around an edge of the source driving chip 131. The adhesive agent AD may surround the source driving chip 131 to fix the source driving chip 131 to the flexible circuit board 132.

A plurality of adhesion patterns AP1 may be on the flexible circuit board 132 to extend in a set or predetermined direction. For example, the adhesion patterns AP1 may extend in the second direction DR2. The adhesion patterns AP1 may extend from the long sides of the source driving chip 131. For example, the adhesion patterns AP1 may extend in (along) the second direction DR2 from set or predetermined portions of the adhesive agent AD on (e.g., extending along) the long sides of the source driving chip 131.

For example, although two adhesion patterns AP1 extend in (along) the second direction DR2 from each of the long sides of the source driving chip 131 in FIG. 3, embodiments of the present disclosure are not limited to the number of adhesion patterns AP1 depicted herein. In some embodiments, for example, one adhesion pattern AP1 may extend in the second direction DR2 from each of the long sides of the source driving chip 131, or two or more adhesion patterns AP1 may extend in the second direction DR2.

Each of the adhesive agent AD and the adhesion patterns AP1 may include the same adhesion material. Non-limiting examples of the adhesion material may include an epoxy resin. However, embodiments of the present disclosure are not limited thereto. For example, the adhesive agent AD may include an adhesion material different from that of the adhesion patterns AP1.

Figure 4:
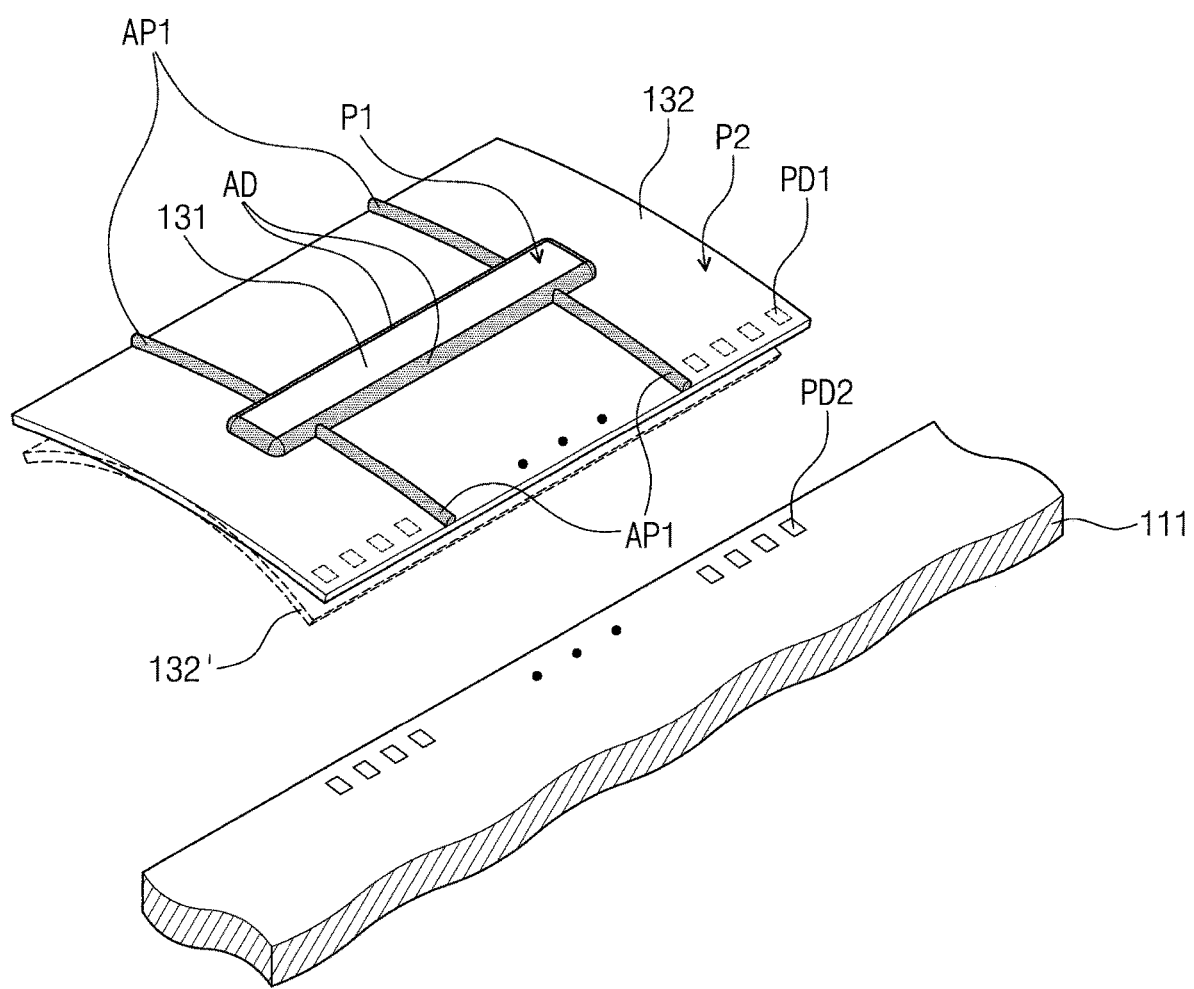
FIG. 4 is a perspective view illustrating a spatial relationship between the flexible circuit board of FIG. 3 and a substrate of the display panel.
Figure 5:
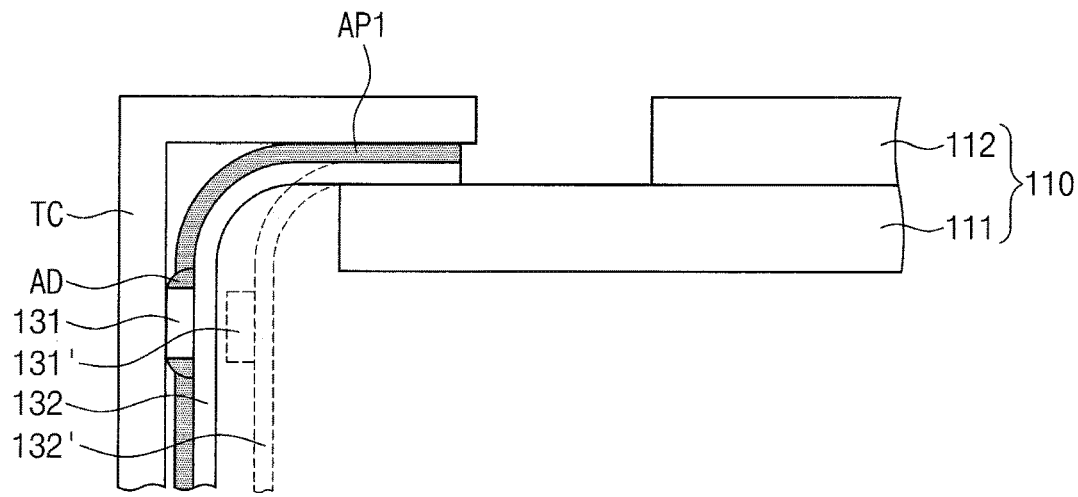
FIG. 5 is a side view illustrating a bent state of the flexible circuit board connected to the first substrate.

FIG. 4 is a perspective view illustrating a spatial relationship between the flexible circuit board of FIG. 3 and the first substrate. FIG. 5 is a side view illustrating a bent state of the flexible circuit board connected to the first substrate.

Referring to FIG. 4, to connect one side of the flexible circuit board 132 to one side of the display panel 110, the one side of the flexible circuit board 132 may be positioned on or over one side of the first substrate 111, for example, one long side of the first substrate 111.

A plurality of first pads PD1 may be on a set or predetermined portion of the flexible circuit board 132 adjacent to one side of the flexible circuit board 132. The first pads PD1 may be on a bottom surface of the flexible circuit board 132. In FIG. 4, the first pads PD1 on the bottom surface of the flexible circuit board 132 are shown by a dotted rectangular shape. A plurality of lines connected to the source driving chip 131 and the first pads PD1 may be on the flexible circuit board 132.

A plurality of second pads PD2 may be on a set or predetermined portion of one side of the first substrate 111. The data lines DL1 to DLn may be connected to the second pads PD2.

To attach the first pads PD1 to the second pads PD2, the first pads PD1 may be aligned with the second pads PD2. After the first pads PD1 are aligned with the second pads PD2, an anisotropic conductive film (ACF) may be placed between the first pads PD1 and the second pads PD2.

When one side of the flexible circuit board 132 is pressed to the first substrate 111, the first pads PD1 may be electrically connected to the second pads PD2 via the ACF. Thus, the source driving chip 131 may be connected to the pixels PX through the flexible circuit board 132.

A flexible circuit board 132' shown by a dotted line in FIG. 4 may represent a flexible circuit board 132' that does not include adhesion patterns AP1. Since the flexible circuit board 132' has flexibility, the edges or sides of the flexible circuit board 132' may droop downward, relative to the flexible circuit board 132 including adhesion patterns AP1. As the display panel 110 increases in size, the flexible circuit board 132' may also increase in size. Thus, a degree of droop and/or bending of the flexible circuit board 132' may increase. For example, the flexible circuit board 132' may have reduced stress (e.g., stiffness).

Since the stress and/or stiffness of the flexible circuit board 132' is reduced, as illustrated in FIG. 4, at least one side of the flexible circuit board 132' may further droop downward. In this case, it may be difficult to align the first pads PD1 on the flexible circuit board 132' with the second pads PD2 on the first substrate 111.

However, in embodiments of the present disclosure, since the adhesion patterns AP1 are on the flexible circuit board 132, the flexible circuit board 132 may have enhanced stress and/or stiffness. As illustrated in FIG. 4, the adhesion patterns AP1 may be positioned to allow the flexible circuit board 132 having enhanced stress to be bent less than the flexible circuit board 132'. Thus, alignment of the first pads PD1 may be more easily performed.

Referring to FIG. 5, after the flexible circuit board 132 is connected to the display panel 110, the flexible circuit board 132 may be bent. In some embodiments, the flexible circuit board 132 may be bent, and the printed circuit board 140 may be on the lower portion of the display panel 110.

The display panel 110 may be accommodated in an accommodation part (e.g., case), and the accommodation part may include a top chassis TC. The top chassis TC may expose a display area of the display panel 110, on which an image is provided, and may be on (e.g., cover) a non-display area around the display area. The top chassis TC may include a metal.

Since the flexible circuit board 132' droops further than the flexible circuit board 132, a source driving chip 131' on the flexible circuit board 132' may not contact the top chassis TC. When the source driving chip 131' is driven, heat may be generated in the source driving chip 131'. Elements of the source driving chip 131' may be damaged by the heat.

Since the top chassis TC includes a metal material, the top chassis TC may serve as a heatsink. However, since the source driving chip 131' does not contact the top chassis TC, the heat generated in the source driving chip 131' may not be dissipated through the top chassis TC.

According to embodiments of the present disclosure, since the flexible circuit board 132 has stress and/or stiffness greater than that of the flexible circuit board 132', the flexible circuit board 132 may be bent less than the flexible circuit board 132'. Thus, as illustrated in FIG. 5, when the flexible circuit board 132 is bent, the source driving chip 131 may contact the top chassis TC, and thus, the heat generated in the source driving chip 131 may be dissipated through the top chassis TC.

FIGS. 6 to 14 are views illustrating adhesion patterns on the flexible circuit board(s) according to one or more embodiments of the present disclosure.

Hereinafter, adhesion patterns of FIGS. 6 to 14 will be mainly described with reference to elements that are different from the adhesion patterns AP1 on the flexible circuit board 132 of FIG. 3. For convenience of description, elements that are the same as or substantially similar to those in FIG. 3 are denoted by the same reference numerals.

Figure 6:
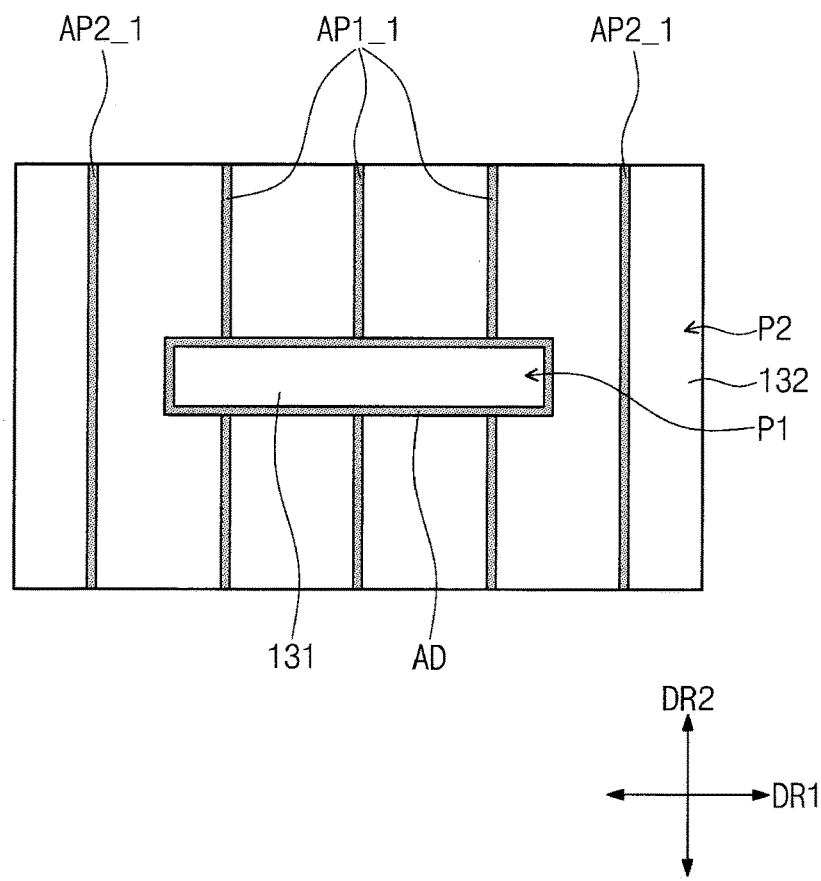
FIGS. 6 to 14 are views illustrating adhesion patterns on the flexible circuit boards according to various embodiments of the present disclosure.

Referring to FIG. 6, adhesion patterns AP1_1 and AP2_1 may include a plurality of first adhesion patterns AP1_1 and a plurality of second adhesion patterns AP2_1. The first adhesion patterns AP1_1 may extend from the long sides of the source driving chip 131 in (along) the second direction DR2. For example, the first adhesion patterns AP1_1 may extend in (along) the second direction DR2 from set or predetermined portions of the adhesive agent AD on (e.g. extending along) the long sides of the source driving chip 131.

The second adhesion patterns AP2_1 may be on the second portion P2, with the source driving chip 131 and the first adhesion patterns AP1_1 therebetween. The second adhesion patterns AP2_1 may extend in (along) the second direction DR2.

Figure 7:
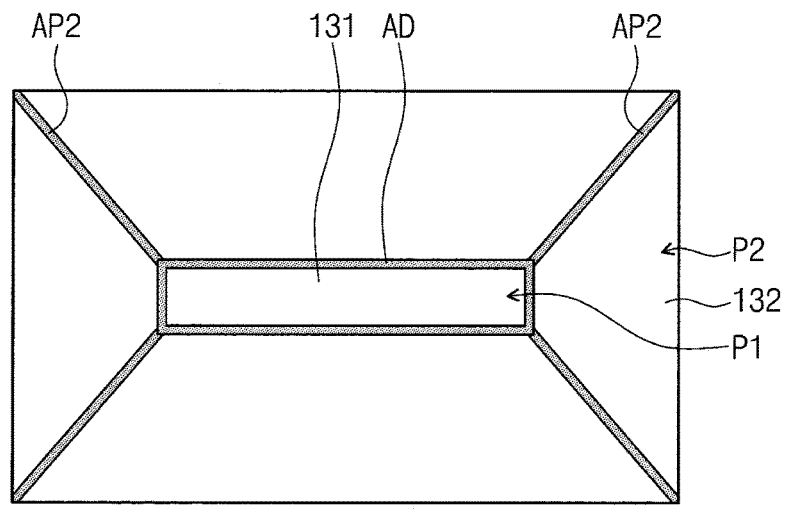
Figure 7:
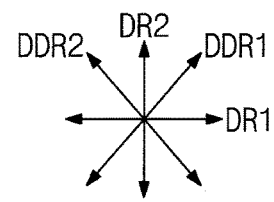

Referring to FIG. 7, the adhesion patterns AP2 may extend in one or more diagonal directions DDR1 and DDR2 passing between the first direction DR1 and the second direction DR2 on a plane defined by the first direction DR1 and the second direction DR2. The diagonal directions DDR1 and DDR2 may include a first diagonal direction DDR1 and a second diagonal direction DDR2.

The first diagonal direction DDR1 may be defined as a direction that is inclined at an angle less than a right angle in a counterclockwise direction from the first direction DR1 to pass through an intersection between the first direction DR1 and the second direction DR2. The second diagonal direction DDR2 may be defined as a direction that is inclined at an angle less than a right angle in a clockwise direction in the first direction DR1 to pass through the intersection between the first direction DR1 and the second direction DR2. Here, the term "less than a right angle" may refer to an angle greater than 0 and less than 90 degrees, for example, between 1 to 89 degrees, between 10 to 80 degrees, between 20 to 70 degrees, or between 30 to 60 degrees, for example, 30 degrees, 45 degrees, or 60 degrees.

The adhesion patterns AP2 may extend in the first diagonal direction DDR1 and/or the second diagonal direction DDR2 and thus extend from edges of the source driving chip 131 to edges of the flexible circuit board 132. For example, the adhesion patterns AP2 may respectively extend from the adhesive agent AD on the edges (corners) of the source driving chip 131 to the edges (corners) of the flexible circuit board 132.

Figure 8:
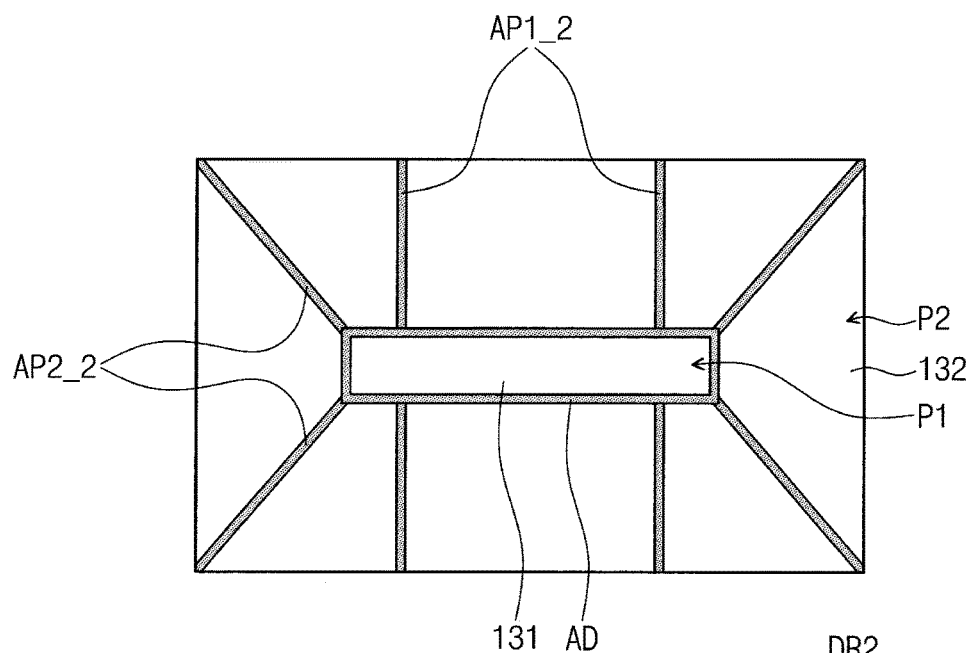
Figure 8:
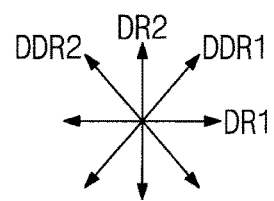

Referring to FIG. 8, adhesion patterns AP1_2 and AP2_2 may include a plurality of first adhesion patterns AP1_2 extending from the long side of the source driving chip 131 in (along) the second direction DR2, and a plurality of second adhesion patterns AP2_2 extending diagonally from the edges (corners) of the source driving chip 131 to the edges (corners) of the flexible circuit board 132. For example, the first adhesion patterns AP1_2 may be the same as or substantially similar to the adhesion patterns AP1 of FIG. 3, and the second adhesion patterns AP2_2 may be the same as or substantially similar to the adhesion patterns AP2 of FIG. 7.

Figure 9:
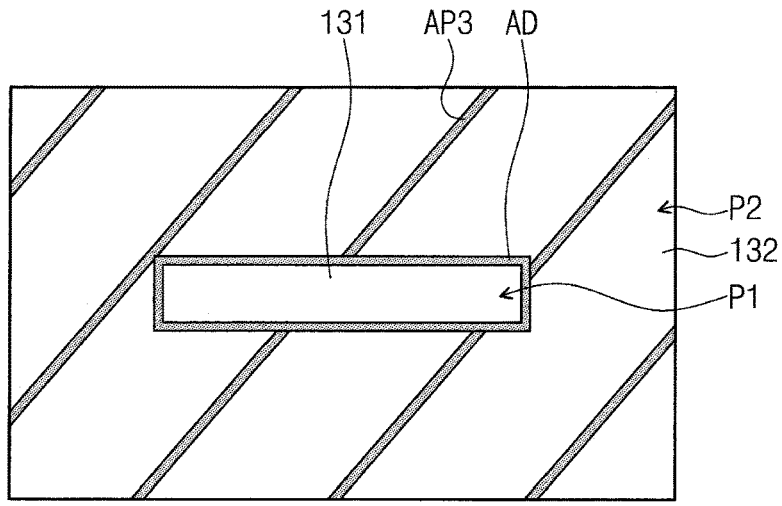
Figure 9:
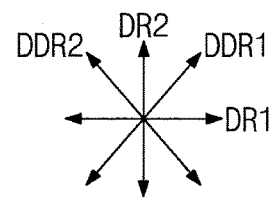

Referring to FIG. 9, adhesion patterns AP3 may extend in (along) the first diagonal direction DDR1. The adhesion patterns AP3 may extend diagonally from the long sides of the source driving chip 131 and also be positioned with the source driving chip 131 therebetween.

Figure 10:
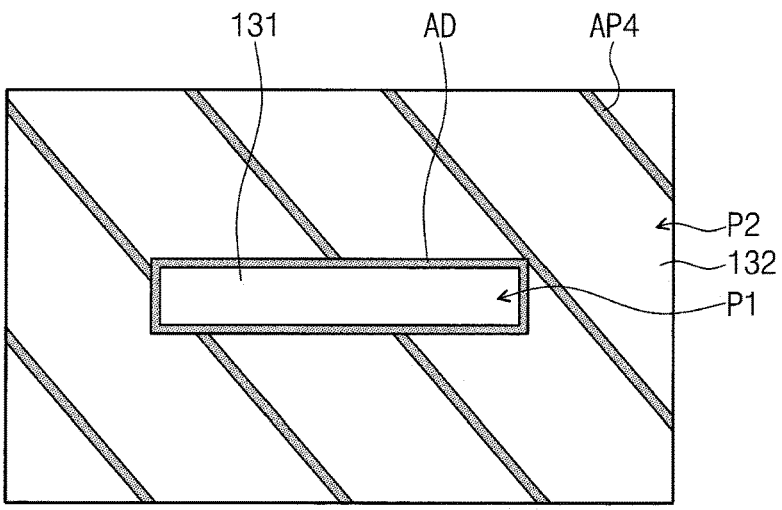
Figure 10:
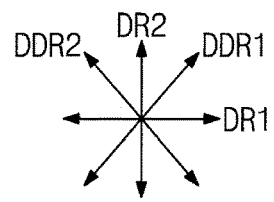

Referring to FIG. 10, adhesion patterns AP4 may extend in (along) the second diagonal direction DDR2. The adhesion patterns AP4 may extend diagonally from the long sides of the source driving chip 131 and also be positioned with the source driving chip 131 therebetween.

Figure 11:
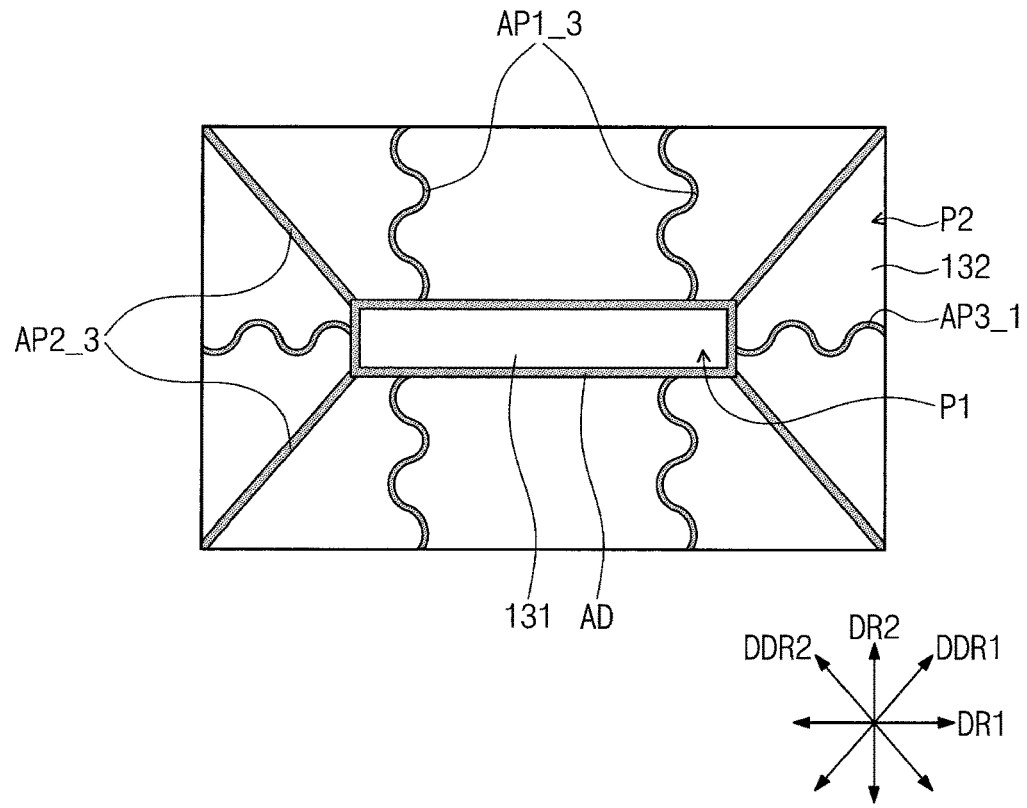

Referring to FIG. 11, adhesion patterns AP1_3, AP2_3, and AP3_1 may include a plurality of first adhesion patterns AP1_3, a plurality of second adhesion patterns AP2_3, and a plurality of third adhesion patterns AP3_1.

The first adhesion patterns AP1_3 may extend from the long sides of the source driving chip 131 in a wave pattern shape in the second direction DR2. The second adhesion patterns AP2_3 may extend in the first and second diagonal directions DDR1 and DDR2 and thus respectively extend from the edges (corners) of the source driving chip 131 to the edges (corners) of the flexible circuit board 132. The third adhesion patterns AP3_1 may extend from the long sides of the source driving chip 131 in a wave pattern shape in the first direction DR1.

Figure 12:
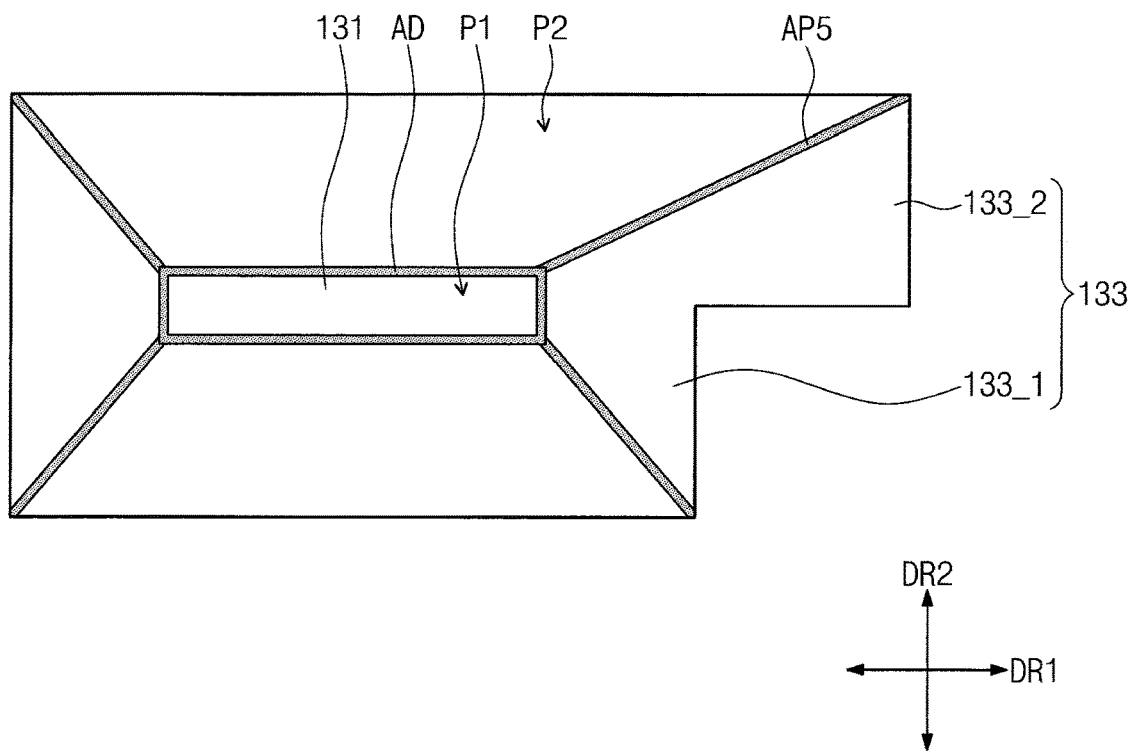

Referring to FIG. 12, adhesion patterns AP5 may respectively extend from the edges (corners) of the source driving chip 131 to set or predetermined edges (corners) of the flexible circuit board 133. The flexible circuit board 133 may include a first flexible circuit board region 133_1 and a second flexible circuit board region 133_2 extending from the first flexible circuit board region 133_1. The second flexible circuit board region 133_2 may have a length greater than that of the first flexible circuit board region 133_1 in the first direction DR1.

Input pads to be connected to the printed circuit board 140 may be on the first flexible circuit board region 133_1. Output pads to be connected to the first substrate 111 may be on the second flexible circuit board region 133_2. When the number of output signals is greater than that of input signals, the flexible circuit board 133 of FIG. 12 and/or the like may be used.

Figure 13:
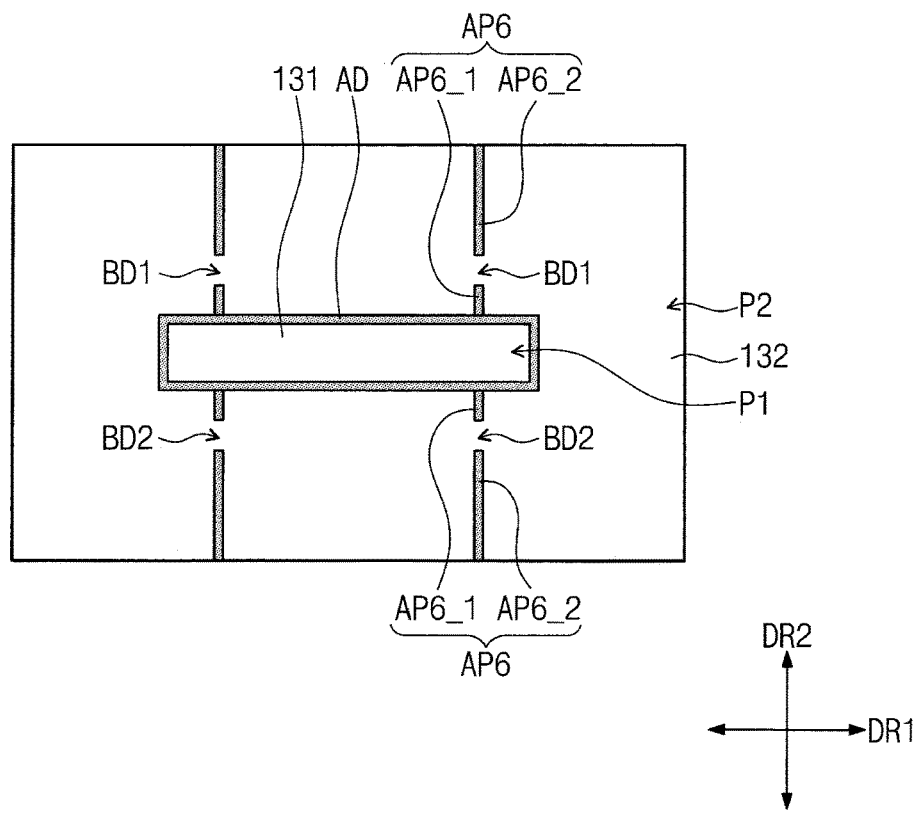
Figure 14:
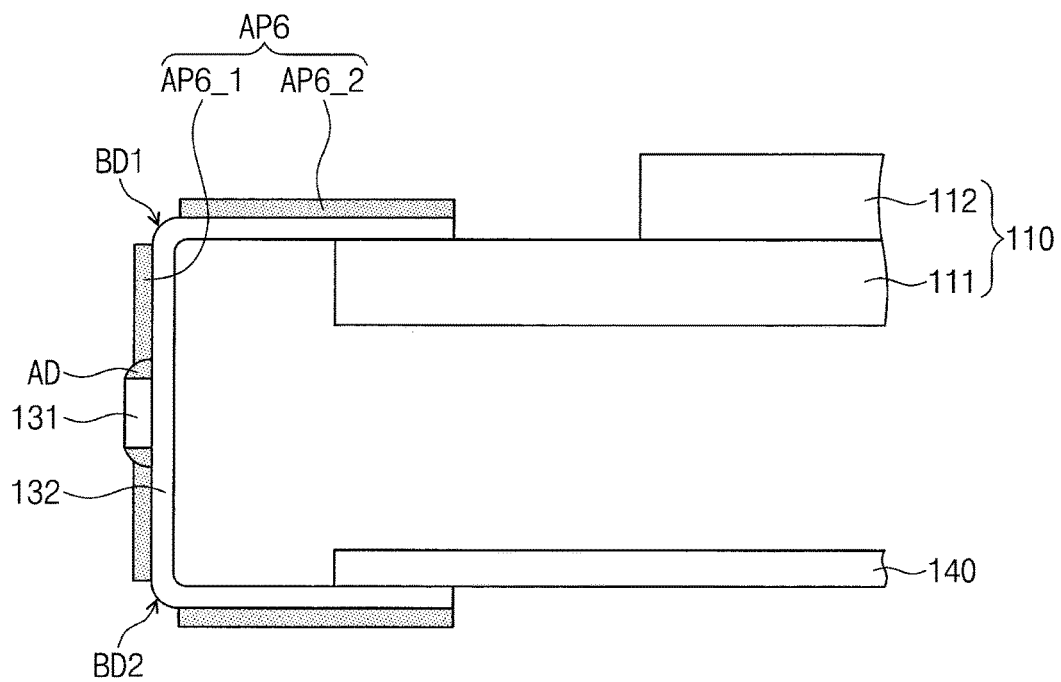

Referring to FIGS. 13 and 14, adhesion patterns AP6 may include first sub adhesion patterns AP6_1 and second sub adhesion patterns AP6_2. Each of the first sub adhesion patterns AP6_1 may extend from long sides of the source driving chip 131 in the second direction DR2. Each of the second sub adhesion patterns AP6_2 may be spaced a set or predetermined distance from the corresponding first sub adhesion patterns AP6_1 of the first sub adhesion patterns AP6_1 in the second direction DR2 to extend in the second direction DR2.

A first bending part BD1 may be defined between the first sub adhesion patterns AP6_1 and the second sub adhesion patterns AP6_2, which are between the side of the flexible circuit board 132 connected to the first substrate 111 and the source driving chip 131. A second bending part BD2 may be defined between the first sub adhesion patterns AP6_1 and the second sub adhesion patterns AP6_2, which are between the other side of the flexible circuit board 132 and the source driving chip 131.

Since the adhesion patterns AP6 are not in the first bending part BD1 and the second bending part BD2, the flexible circuit board 132 may be more easily bent at the first bending part BD1 and the second bending part BD2. In some embodiments, the printed circuit board 140 may be on or directly on the lower surface of the display panel 110, for example, on or directly on (e.g., contacting) the lower surface of the first substrate 111, for example, without a gap.

According to embodiments of the present disclosure, the display device may include the adhesion patterns on the flexible circuit boards to extend in one or more set or predetermined directions to enhance the stress and/or stiffness of the flexible circuit boards, thereby facilitating easy alignment of the first and second pads.

As used herein, expressions such as "at least one of", "one of", and "selected from", when preceding a list of elements, modify the entire list of elements and do not modify the individual elements of the list. Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be apparent to those skilled in the art that various modifications and variations can be made to embodiments of the present disclosure. Thus, the present disclosure covers such modifications as being within the scope of the appended claims and their equivalents. Thus, to the maximum extent allowed by law, the scope of the present disclosure is to be determined by the broadest permissible interpretation of the following claims and equivalents thereof, and shall not be restricted or limited by the foregoing detailed description.

What is claimed is:

1. A display device comprising:
   a display panel comprising a plurality of pixels;
   at least one flexible circuit board connected to one side of the display panel and comprising a first portion and a second portion circumscribing the first portion;
   a source driving chip on the first portion; and
   a plurality of adhesion patterns on the second portion and extending in a set or predetermined direction.

2. The display device of claim 1, wherein the source driving chip and the flexible circuit board each have a rectangular shape having long sides in a first direction and short sides in a second direction crossing the first direction.

3. The display device of claim 2, wherein the adhesion patterns extend from the long sides of the source driving chip in the second direction, and the second direction intersects the display panel.

4. The display device of claim 3, wherein one of the long sides of the flexible circuit board is connected to one side of the display panel.

5. The display device of claim 2, further comprising an adhesive agent on an edge of the source driving chip.

6. The display device of claim 5, wherein the adhesion patterns and the adhesive agent comprise the same adhesion material.

7. The display device of claim 6, wherein the adhesion material comprises an epoxy resin.

8. The display device of claim 2, wherein the adhesion patterns comprise:
   a plurality of first adhesion patterns extending from the long sides of the source driving chip in the second direction; and
   a plurality of second adhesion patterns on the second portion with the source driving chip and the first adhesion patterns therebetween to extend in the second direction.

9. The display device of claim 2, wherein the adhesion patterns extend in one or more diagonal directions passing between the first direction and the second direction on a plane defined by the first direction and the second direction.

10. The display device of claim 9, wherein the one or more diagonal directions comprise:
    a first diagonal direction that is inclined at an angle less than a right angle in a counterclockwise direction from the first direction to pass through an intersection between the first direction and the second direction; and
    a second diagonal direction that is inclined at an angle less than a right angle in a clockwise direction from the first direction to pass through an intersection between the first direction and the second direction.

11. The display device of claim 9, wherein the adhesion patterns respectively extend from edges of the source driving chip to edges of the flexible circuit board.

12. The display device of claim 10, wherein the adhesion patterns extend in the first diagonal direction.

13. The display device of claim 10, wherein the adhesion patterns extend in the second diagonal direction.

14. The display device of claim 2, wherein the adhesion patterns comprise:
    a plurality of first adhesion patterns extending from the long sides of the source driving chip in the second direction; and
    a plurality of second adhesion patterns extending from edges of the source driving chip to edges of the flexible circuit board.

15. The display device of claim 2, wherein the adhesion patterns comprise:
    a plurality of first adhesion patterns extending in a wave pattern shape from the long sides of the source driving chip in the second direction;
    a plurality of second adhesion patterns extending from edges of the source driving chip to edges of the flexible circuit board; and
    a plurality of third adhesion patterns extending in a wave pattern shape from the short sides of the source driving chip in the first direction.

16. The display device of claim 2, wherein the adhesion patterns comprise:
    a first sub adhesion pattern extending from one of the long sides of the source driving chip in the second direction; and
    a second sub adhesion pattern spaced a set or predetermined distance from the first sub adhesion pattern in the second direction to extend in the second direction.

17. A display device comprising:
    a display panel comprising a plurality of pixels;
    a plurality of flexible circuit boards, each being connected to one side of the display panel and comprising a first portion and a second portion circumscribing the first portion;
    a plurality of source driving chips on the first portions of the plurality of flexible circuit boards; and a plurality of adhesion patterns on the second portions of the plurality of flexible circuit boards,
    wherein the adhesion patterns comprise a plurality of first adhesion patterns extending in a direction crossing an extension direction of the one side of the display panel.

18. The display device of claim 17, wherein each source driving chip has a rectangular shape having long sides in a first direction and short sides in a second direction crossing the first direction, wherein the first direction is defined as being parallel to the extension direction of the one side of the display panel, and
    the first adhesion patterns extend from the long sides of each source driving chip in the second direction.

19. The display device of claim 18, wherein the adhesion patterns further comprise a plurality of second adhesion patterns on the second portion with the first adhesion patterns and the source driving chip therebetween to extend in the second direction.

20. A display device comprising:
a display panel comprising a plurality of pixels;
a plurality of flexible circuit boards having a rectangular shape having long sides parallel to a first direction and short sides parallel to a second direction crossing the first direction and connected to one side of the display panel;
a plurality of source driving chips on the plurality of flexible circuit boards; and
a plurality of adhesion patterns on the plurality of flexible circuit boards to respectively extend from edges of each of the source driving chips,
    wherein the adhesion patterns extend in a diagonal direction between the first direction and the second direction on a plane defined by the first direction and the second direction.

* * * * *